United States Patent
Ye

(10) Patent No.: US 7,764,074 B2
(45) Date of Patent: Jul. 27, 2010

(54) PROBE OF DETECTOR FOR TESTING PINS OF ELECTRONIC COMPONENT

(75) Inventor: Rui Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsian (TW)

( * ) Notice: Subject to any disclaimer, the term of this patent is extended or adjusted under 35 U.S.C. 154(b) by 47 days.

(21) Appl. No.: 12/202,334

(22) Filed: Sep. 1, 2008

(65) Prior Publication Data

US 2009/0322361 A1    Dec. 31, 2009

(30) Foreign Application Priority Data

Jun. 27, 2008    (CN)    .................... 2008 1 0302395

(51) Int. Cl.
 *G01R 31/02* (2006.01)
(52) U.S. Cl. .................... 324/754; 324/761; 324/762
(58) Field of Classification Search .................... None
 See application file for complete search history.

(56) References Cited

U.S. PATENT DOCUMENTS

| 4,724,180 | A | * | 2/1988 | Kern | .......................... 428/131 |
| 5,997,314 | A | * | 12/1999 | Wallace et al. | ................. 439/63 |
| 6,498,506 | B1 | * | 12/2002 | Beckous | ..................... 324/761 |
| 7,015,708 | B2 | * | 3/2006 | Beckous et al. | ............. 324/754 |

* cited by examiner

*Primary Examiner*—Minh N Tang
(74) *Attorney, Agent, or Firm*—Zhigang Ma

(57) ABSTRACT

A probe of a detector includes a shield, an anode member, and a cathode member. The shield includes a top wall and a plurality of sidewalls extending down from the sides of the top wall. A first through hole and a second through hole are defined in the top wall. The anode member includes a first mounting portion, a first pin, and a first connecting portion connected between the first mounting portion and the first pin. The cathode member includes a second mounting portion, a second pin, and a second connecting portion connected between the second mounting portion and the second pin. The first and second mounting portions are respectively rotating within the first and second through holes to adjust corresponding ends of the first and second pins to come in contact with the electronic component.

14 Claims, 6 Drawing Sheets

PROBE OF DETECTOR FOR TESTING PINS OF ELECTRONIC COMPONENT

BACKGROUND

1. Field of the Invention

The present invention relates to a probe of a detector.

2. Description of Related Art

Referring to FIG. 6, a related-art probe of an oscillograph is shown. The probe includes a shield 2 and two pins 1 mounted to the shield 2. The pins 1 are configured to collect signals of an electronic component to be tested. The shield 2 is configured to reduce electromagnetic interference. In use, insulated paint covering the electronic component to be tested should be scraped off. An end of a wire is welded to the electronic component, and the other end of the wire is connected to the pins 1. Welding the wire to the electronic component is time-consuming and laboring, and the electronic component might be damaged because of the welding.

Therefore, what is needed, is a detector probe which is able to be conveniently used.

DETAILED DESCRIPTION

Figure 1:
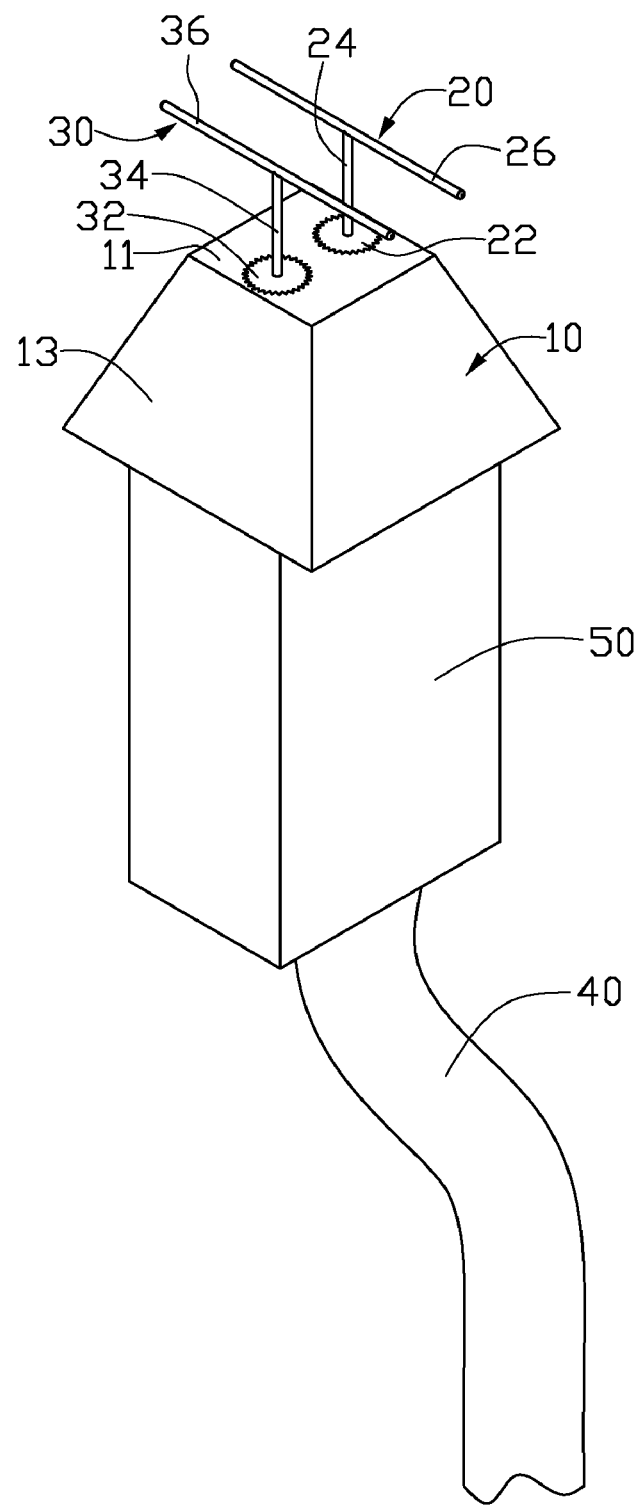
FIG. 1 is an isometric view of a probe of a detector in accordance with a first embodiment of the present invention, the probe including a shield and an anode.
Figure 2:
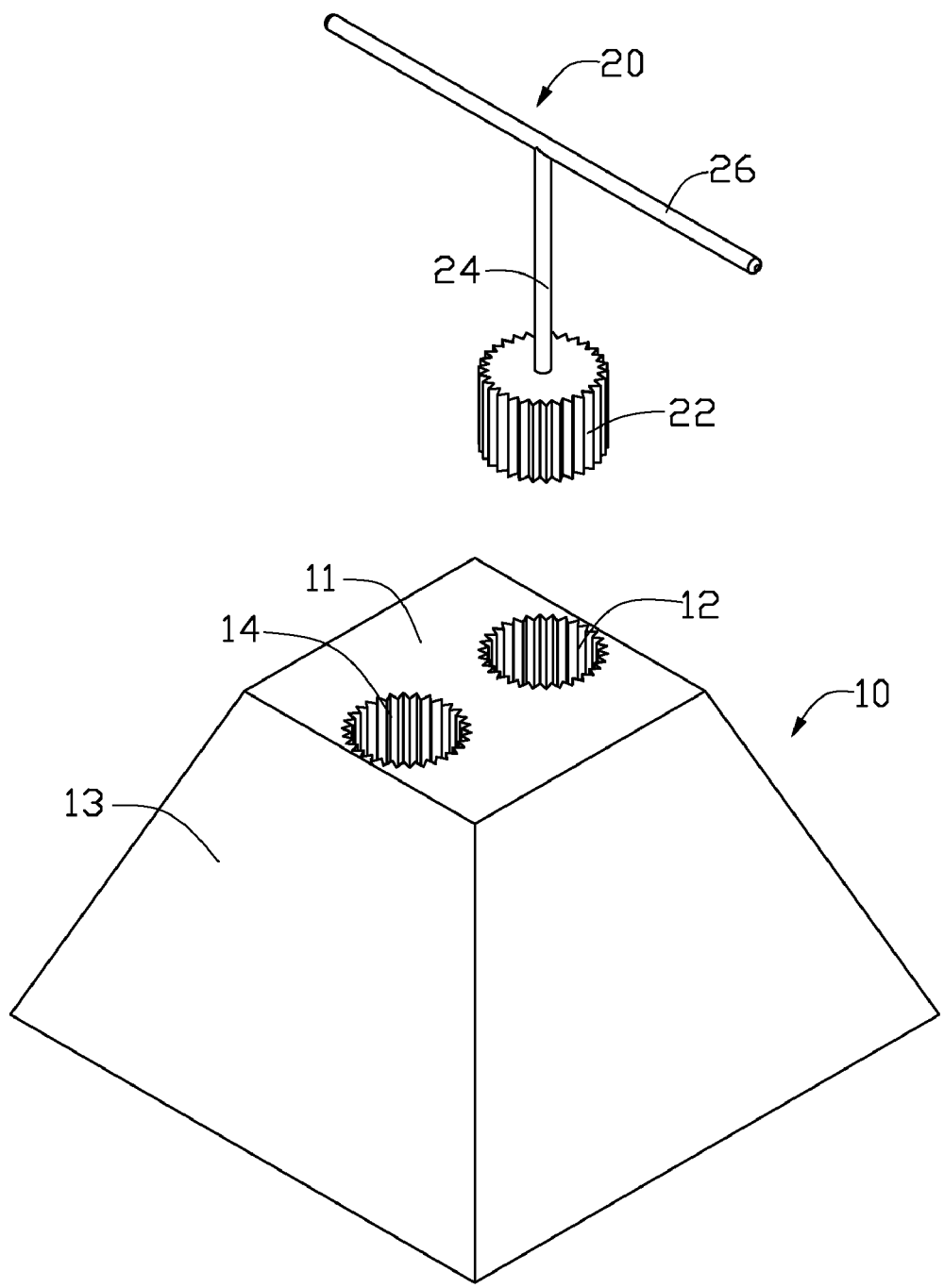
FIG. 2 is an exploded, isometric view of the shield and the anode of FIG. 1.
Figure 3:
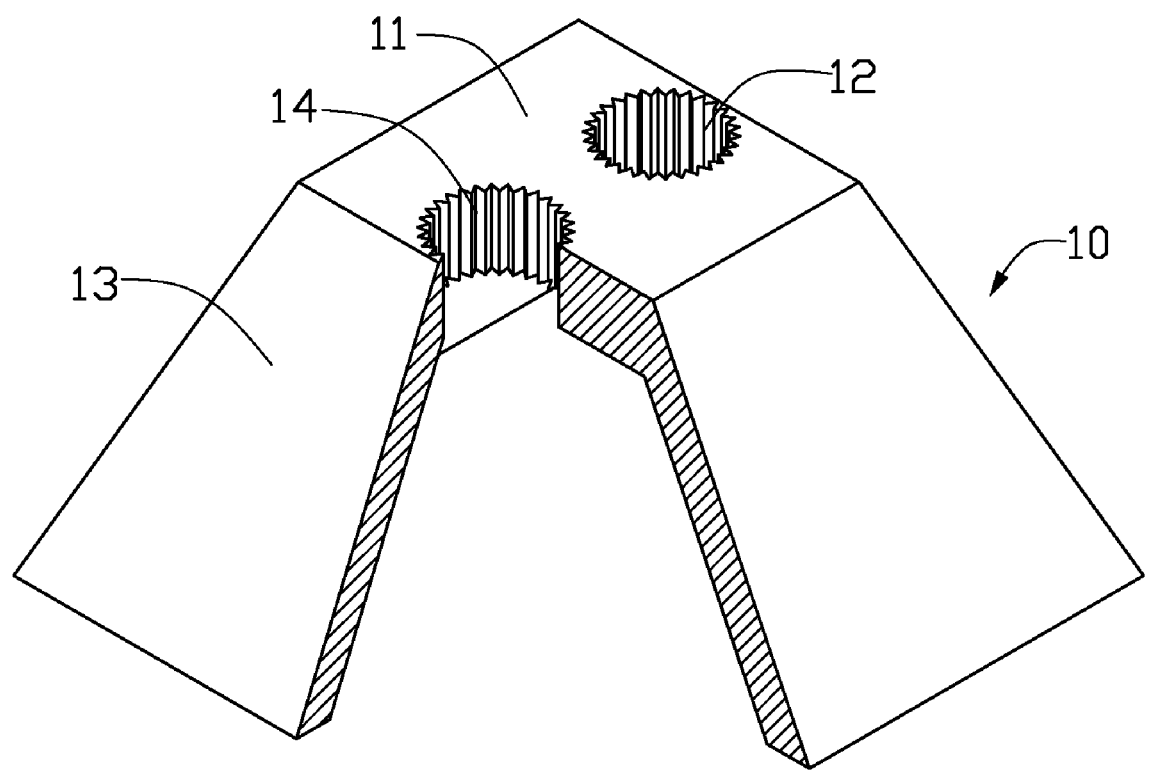
FIG. 3 is a partial, cutaway view of the shield of FIG. 2.

Referring to FIGS. 1 to 3, a probe of a detector in accordance with a first embodiment of the present invention includes a shield 10, an anode member 20, a cathode member 30, a cable 40, and a securing member 50.

The shield 10 for reducing electromagnetic interference is generally funnel-shaped, and includes a rectangular top wall 11 and four trapezoid-shaped sidewalls 13 slantingly extending down from four sides of the top wall 11. A first through hole 12 and a second through hole 14 are defined in the top wall 11. A plurality of teeth are formed on the inner wall of each of the first and second through holes 12, 14.

The anode member 20 includes a first mounting portion 22, a first connecting portion 24, and a first pin 26. The first mounting portion 22 is a gear engaged in the first through hole 12 of the shield 10. A plurality of gears are formed on the circumference of the first mounting portion 22 to mesh with the teeth of the first through hole 12 of the shield 10. A first end of the first connecting portion 24 is extended end to end through the first mounting portion 22. A second end opposite to the first end of the first connecting portion 24 is connected to a center of the first pin 26 to form a T shape.

The cathode member 30 has a shape similar to the anode member 20 and includes a second mounting portion 32, a second connecting portion 34, and a second pin 36.

In this embodiment, the length of each of the first connecting portion 24, the first pin 26, the second connecting portion 34, and the second pin 36 are adjustable like a retractable antenna. In other embodiments, the length of each of the first connecting portion 24, the first pin 26, the second connecting portion 34, and the second pin 36 are not adjustable.

The securing member 50 is hollow and mounted to a bottom of the shield 10. One end of the cable 40 is extended through the securing member 50 to be electrically connected to the first end of the first connecting portion 24 of the anode member 20 via electric cables, and also electrically connected to the first end of the second connecting portion 34 of the cathode member 30 with the other electric cables. The other end of the cable 40 is connected to a detector 70 (see FIG. 4).

Figure 4:
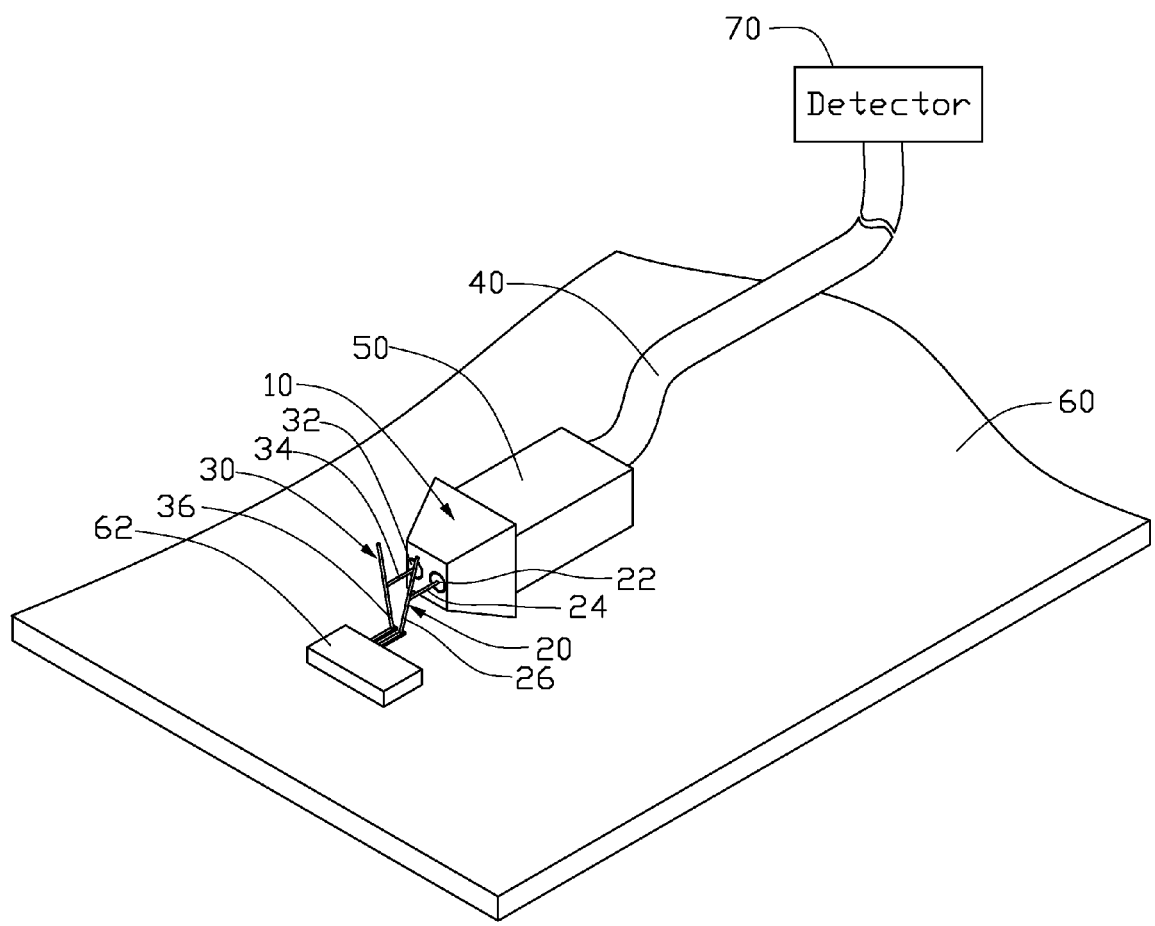
FIG. 4 is an isometric view of the probe in a using state.

Referring also to FIG. 4, in use, to adjust ends of the first pin 26 and the second pin 36 to correspondingly come in contact with two pins of an electronic component 62 mounted to a printed circuit board 60 for testing, the first mounting portion 22 and the second mounting portion 32 are correspondingly rotated in the first and second through holes 12, 14 of the shield 10. The cable 40 is connected to the detector 70. In addition, the length of the first connecting portion 24, the first pin 26, the second connecting portion 34, and the second pin 36 can be adjusted to make a lower part of a sidewall 13 of the shield 10 contact with the printed circuit board 60. Therefore, the probe can be located on the printed circuit board 60 steadily. The first pin 26 and the second pin 36 collect signals of the electronic component 62 and transmit the signals to the detector 70. The detector 70 is configured to process the signals and get a test result.

Figure 5:
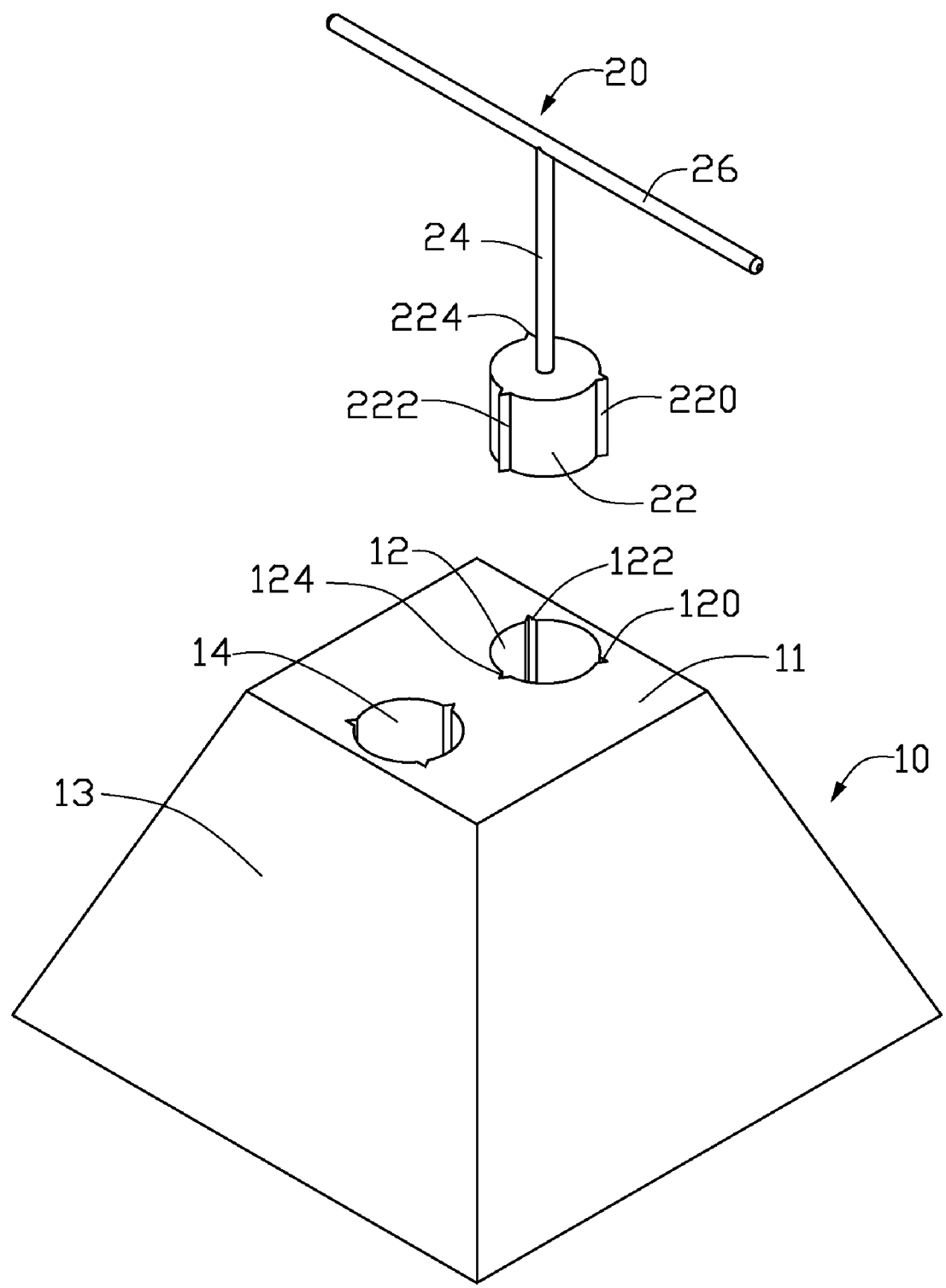
FIG. 5 is an exploded, isometric view of a shield and an anode of a probe in accordance with a second embodiment of the present invention.
Figure 6:
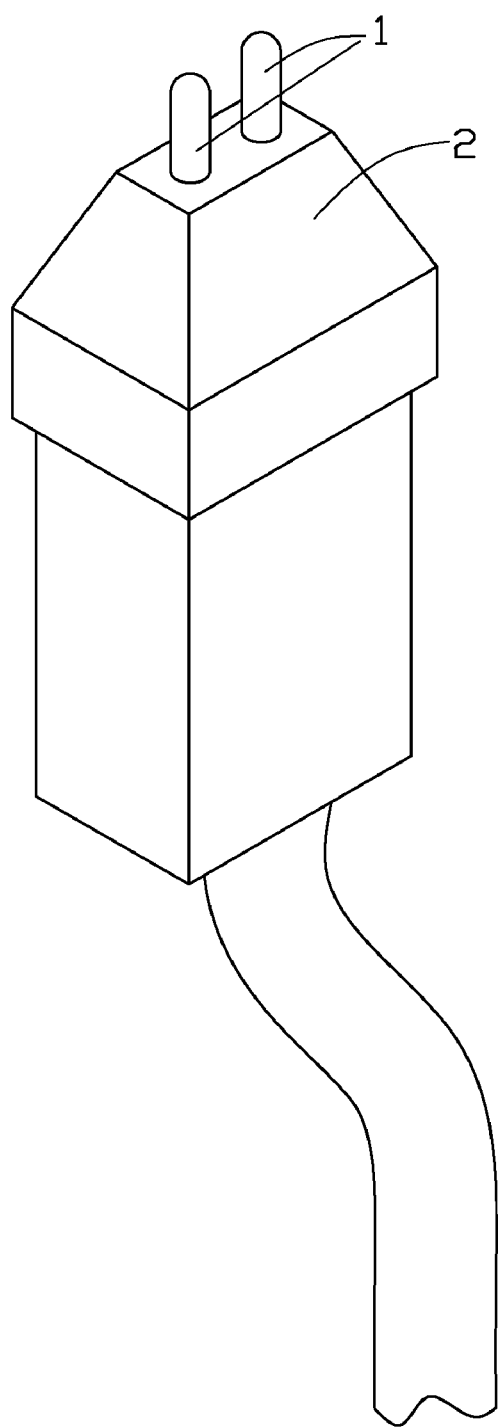
FIG. 6 is an isometric view of a related-art probe for an oscillograph.

Referring to FIG. 5, a probe of a detector in accordance with a second embodiment of the present invention includes a shield 10 for reducing electromagnetic interference, an anode member 20, a cathode member (not shown), and a cable (not shown).

The shield 10 is generally similar to the shield 10 of the first embodiment; differences are that three grooves 120, 122, and 124 are longitudinally defined in the inner wall of the first through hole 12. The second through hole 14 is similar to the first through hole 12. The anode member 20 is generally similar to the anode member 20 of the first embodiment; differences are that three longitudinal ribs 220, 222, and 224 extending from a circumference of the first mounting portion 22. The cathode member is similar to the anode member 20. The first mounting portion 22 of the anode member 20 is received in the first through hole 12, with the ribs 220, 222, and 224 thereof being accommodated in the corresponding grooves 120, 122, and 124. In use, the first mounting portion 22 of the anode member 20 is rotated in the first through hole 12 of the shield 10, the rib 220 can be accommodated in one of the grooves 120, 122, 124, and the other ribs 222, 224 thus can be accommodated in the other grooves. Therefore, a direction of the first pin 26 of the first anode member 20 can be adjusted. Also, the length of each of the first connecting portion 24 and the first pin 26 of the anode member 20 in this embodiment is adjusted.

In other embodiments, the first mounting portion 22 of the anode 20 can be other shaped, such as cube-shaped with at least two ribs or grooves formed in two sidewalls. Accordingly, the first through hole 12 is cube-shaped, with at least two grooves or ribs being formed in an inner wall. Moreover, the first pin 26 can be connected to the first connecting portion 24 to form a "+" shape, or an L shape.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A probe of a detector comprising:
   a shield comprising a top wall and a plurality of sidewalls extending down from sides of the top wall, wherein a first through hole and a second through hole are defined in the top wall;
   an anode member comprising a first mounting portion, a first pin, and a first connecting portion connected between the first mounting portion and the first pin; and
   a cathode member comprising a second mounting portion, a second pin, and a second connecting portion connected between the second mounting portion and the second pin;
   wherein the first mounting portion is rotated in the first through hole to adjust a direction of the first pin, and the second mounting portion is rotated in the second through hole to adjust a direction of the second pin.

2. The probe as claimed in claim 1, further comprising a securing member, wherein the securing member is hollow and mounted to a bottom of the shield.

3. The probe as claimed in claim 1, wherein the shield is funnel-shaped.

4. The probe as claimed in claim 1, wherein the inner walls of the first and second through holes define a plurality of teeth respectively; the first and second mounting portions comprise a plurality of teeth formed on the circumferences thereof respectively, and are engaged in the first and second through holes correspondingly.

5. The probe as claimed in claim 1, wherein the inner wall of the first through hole longitudinally defines at least three grooves therein; the first mounting portion comprises at least three longitudinal ribs extending from a circumference thereof, and the ribs are selectively accommodated in the corresponding grooves.

6. The probe as claimed in claim 1, wherein the inner wall of the second through hole longitudinally defines at least three grooves therein; the second mounting portion comprises at least three longitudinal ribs extending from a circumference thereof, and the ribs are selectively accommodated in the corresponding grooves.

7. The probe as claimed in claim 1, wherein the length of each of the first and second connecting portions is adjustable.

8. The probe as claimed in claim 7, wherein the first connection portion is perpendicularly connected to the first pin, the second connection portion is perpendicularly connected to the second pin.

9. A method for testing an electronic component with a probe of a detector, the method comprising:
   providing:
      a shield defining a first through hole and a second through hole therein;
      an anode member with a first mounting portion, a first pin, and a first connecting portion connected between the first mounting portion and the first pin; and
      a cathode member with a second mounting portion, a second pin, and a second connecting portion connected between the second mounting portion and the second pin;
   connecting the anode member and cathode member to the detector via wires;
   rotating the first mounting portion within the first through hole to adjust an end of the first pin to come in contact with the electronic component, and rotating the second mounting portion within the second through hole to adjust an end of the second pin to come in contact with the electronic component;
   collecting signals of the electronic component and transmitting the signals to the detector; and
   processing the signals and getting a test result.

10. The method as claimed in claim 9, further providing a securing member, wherein the securing member is hollow and mounted to a bottom of the shield.

11. The method as claimed in claim 9, wherein the first and second through holes define a plurality of teeth formed on the inner walls thereof respectively; the first and second mounting portions define a plurality of teeth formed on circumferences thereof, and are engaged in the first and second through holes respectively.

12. The method as claimed in claim 9, wherein the first and second through holes define at least three grooves longitudinally defined in the inner walls thereof respectively; the first and second mounting portions define at least three longitudinal ribs extending from circumferences thereof respectively, and the ribs are selectively accommodated in the corresponding grooves.

13. A probe of a detector comprising:
   a shield with a first through hole and a second through hole being defined therein, wherein the inner walls of the first and second through holes define a plurality of teeth respectively;
   an anode member with a first end coming in contact with an electronic component to be tested, and a second end, wherein the second end of the anode member comprise a plurality of teeth formed on the circumference thereof, and is engaged in the first through hole to adjust a direction of the first end;
   a cathode member with a first end coming in contact with the electronic component to be tested, and a second end, wherein the second end of the cathode member comprises a plurality of teeth formed on the circumference thereof, and is engaged in the second through hole to adjust a direction of the first end of the cathode member; and
   electric cables connecting the anode member and the cathode member to the detector.

14. The probe as claimed in claim 13, wherein the shield is funnel-shaped.

* * * * *